United States Patent
Vimercati

(10) Patent No.: US 10,504,576 B2
(45) Date of Patent: Dec. 10, 2019

(54) CURRENT SEPARATION FOR MEMORY SENSING

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/846,765

(22) Filed: Dec. 19, 2017

(65) Prior Publication Data
US 2019/0189178 A1      Jun. 20, 2019

(51) Int. Cl.
*G11C 11/22*     (2006.01)
*G11C 13/00*     (2006.01)
*G11C 11/56*     (2006.01)

(52) U.S. Cl.
CPC ........ *G11C 11/2273* (2013.01); *G11C 11/221* (2013.01); *G11C 11/2275* (2013.01); *G11C 11/2293* (2013.01); *G11C 11/2297* (2013.01); *G11C 13/004* (2013.01); *G11C 11/5657* (2013.01)

(58) Field of Classification Search
CPC .............. G11C 11/221; G11C 11/2273; G11C 11/2275; G11C 11/2293
USPC ........................................................ 365/145
See application file for complete search history.

(56) References Cited

U.S. PATENT DOCUMENTS

| | | | |
|---|---|---|---|
| 2004/0057274 A1* | 3/2004 | Dimmler | G11C 11/22 365/145 |
| 2006/0062042 A1 | 3/2006 | Karlsson et al. | |
| 2006/0083049 A1 | 4/2006 | Chandler et al. | |
| 2008/0225570 A1 | 9/2008 | Lin et al. | |
| 2012/0170348 A1 | 7/2012 | Clinton et al. | |
| 2014/0233296 A1 | 8/2014 | Noh et al. | |
| 2016/0027488 A1 | 1/2016 | Kim | |
| 2017/0133076 A1 | 5/2017 | Johnson | |

OTHER PUBLICATIONS

U.S. Appl. No. 15/669,290, entitled, "Wear Leveling", filed Aug. 4, 2017, 28 pp.
International Search Report and Written Opinion from related international application No. PCT/US2018/064664, dated Apr. 2, 2019, 14 pp.
Office Action from related Taiwan Patent Application No. 107145394, dated Jul. 26, 2019, 23 pages.

\* cited by examiner

*Primary Examiner* — Anthan Tran
(74) *Attorney, Agent, or Firm* — Brooks, Cameron & Huebsch, PLLC

(57) ABSTRACT

The present disclosure includes apparatuses, methods, and systems for current separation for memory sensing. An embodiment includes applying a sensing voltage to a memory cell having a ferroelectric material, and determining a data state of the memory cell by separating a first current output by the memory cell while the sensing voltage is being applied to the memory cell and a second current output by the memory cell while the sensing voltage is being applied to the memory cell, wherein the first current output by the memory cell corresponds to a first polarization state of the ferroelectric material of the memory cell and the second current output by the memory cell corresponds a second polarization state of the ferroelectric material of the memory cell.

30 Claims, 4 Drawing Sheets

CURRENT SEPARATION FOR MEMORY SENSING

TECHNICAL FIELD

The present disclosure relates generally to semiconductor memory and methods, and more particularly, to current separation for memory sensing.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), ferroelectric random-access memory (FeRAM), resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor). Such memory cells can be programmed to store data corresponding to a target data state by varying the charge level of the storage element (e.g., different levels of charge of the capacitor may represent different data sates). For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1A:
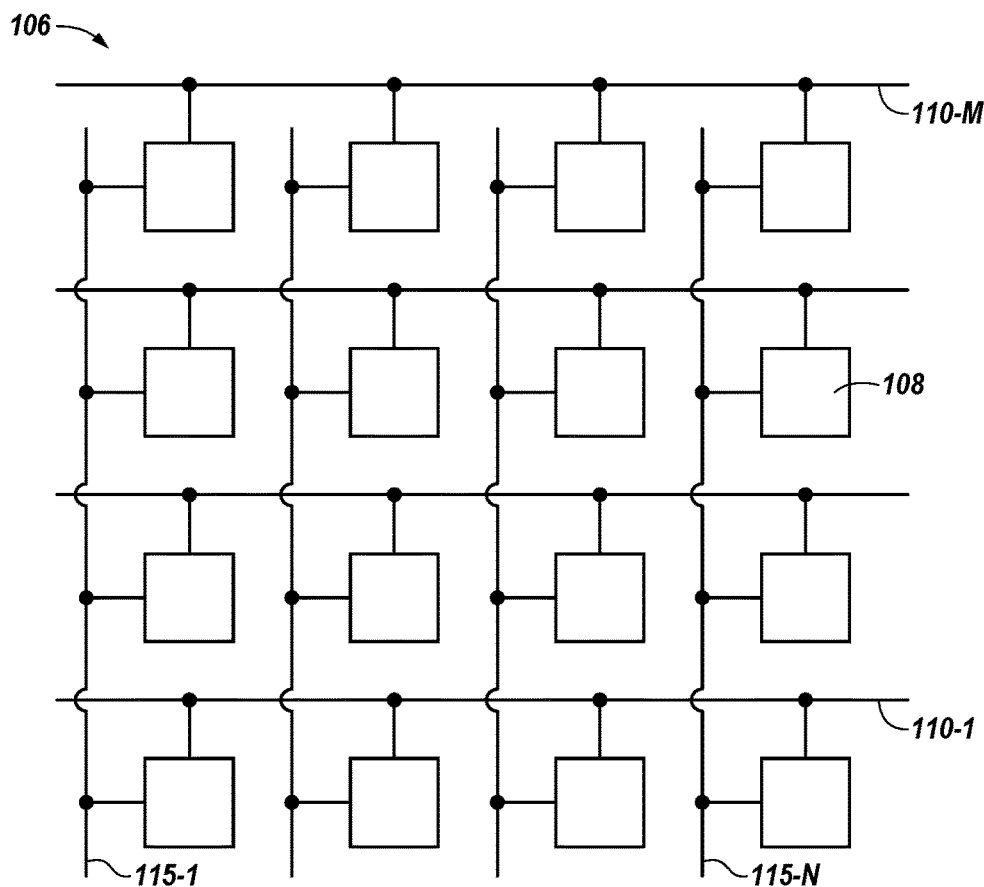
FIG. 1A illustrates an example of a memory array in accordance with an embodiment of the present disclosure.

The present disclosure includes apparatuses, methods, and systems for current separation for memory sensing. An embodiment includes applying a sensing voltage to a memory cell having a ferroelectric material, and determining a data state of the memory cell by separating a first current output by the memory cell while the sensing voltage is being applied to the memory cell and a second current output by the memory cell while the sensing voltage is being applied to the memory cell, wherein the first current output by the memory cell corresponds to a first polarization state of the ferroelectric material of the memory cell and the second current output by the memory cell corresponds a second polarization state of the ferroelectric material of the memory cell.

Sensing memory (e.g., FeRAM memory) using current separation in accordance with the present disclosure can be faster, use less power, and/or be more reliable than previous approaches for sensing memory. For example, sensing memory using current separation in accordance with the present disclosure can increase the size of the sensing window used to distinguish between the data states of the memory as compared to sensing windows used in previous sensing approaches, which can make sense operations performed using current separation in accordance with the present disclosure more reliable (e.g., accurate) than previous sensing approaches. Further, the sensing window used to sense memory in accordance with the present disclosure can be obtained faster than sensing windows used in previous sensing approaches, which can increase the speed of sense operations performed using current separation in accordance with the present disclosure (e.g., increase the speed at which the data states can be distinguished) as compared to previous sensing approaches. Additionally, the circuitry used to sense memory in accordance with the present disclosure can include a capacitor (e.g., an amplification capacitor) that has a lower capacitance than capacitors used in previous sensing approaches, which can reduce the size and/or power consumption of the sense circuitry of the present disclosure as compared to that of previous sensing approaches.

As used herein, "a" or "an" can refer to one or more of something, and "a plurality of" can refer to more than one of such things. For example, a memory cell can refer to one or more memory cells, and a plurality of memory cells can refer to two or more memory cells. Additionally, the designators "M" and "N" as used herein, particularly with respect to reference numerals in the drawings, indicates that one or more of the particular feature so designated can be included with embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIGS. 1A and 1B, and a similar element may be referenced as 308 in FIG. 3.

FIG. 1A illustrates an example of a memory array 106 in accordance with an embodiment of the present disclosure. Memory array 106 can be, for example, a ferroelectric memory (e.g., FeRAM) array.

As shown in FIG. 1A, memory array 106 may include memory cells 108 that may be programmable to store different states. A memory cell 108 may include a capacitor to store a charge representative of the programmable states. For example, a charged and uncharged capacitor may respectively represent two logic states (e.g. 0 and 1). A memory cell 108 may include a capacitor with a ferroelectric material, such as, for instance, an oxide material such as lead zirconate titanate (PZT) in some examples. For example, ferroelectric materials may have a non-linear relationship between an applied electric field and stored charge (e.g., in the form of a hysteresis loop, as will be further described in connection with FIG. 2), and may have a spontaneous electric polarization (e.g., a non-zero polarization in the absence of an electric field). Different levels of charge of a ferroelectric capacitor may represent different logic states, for example.

As shown in FIG. 1A, a memory cell 108 may be coupled to a respective access line, such as a respective one of access lines 110-1 to 110-M, and a respective data (e.g., digit) line, such as one of data lines 115-1 to 115-N. For example, a memory cell 108 may be coupled between an access line 110 and a data line 115. In an example, access lines 110 may also be referred to as word lines, and data lines 115 may also be referred to as bit lines. Access lines 110 and data lines 115, for example, may be made of conductive materials, such as copper, aluminum, gold, tungsten, etc., metal alloys, other conductive materials, or the like.

In an example, memory cells 108 commonly coupled to an access line 110 may be referred to as a row of memory cells. For example, access lines 110 may be coupled to a row decoder (not shown in FIG. 1A), and data lines 115 may be coupled to a column decoder (not shown in FIG. 1A). Operations such as programming (e.g., reading) and sensing (e.g., writing) may be performed on memory cells 108 by activating or selecting the appropriate access line 110 and a data line 115 (e.g., by applying a voltage to the access line). Activating an access line 110 may electrically couple the corresponding row of memory cells 108 to their respective data lines 115.

Although not shown in FIG. 1A for clarity and so as not to obscure embodiments of the present disclosure, memory array 106 can be included in an apparatus in the form of a memory device. As used herein, an "apparatus" can refer to, but is not limited to, any of a variety of structures or combinations of structures, such as a circuit or circuitry, a die or dice, a module or modules, a device or devices, or a system or systems, for example. Further, the apparatus (e.g., memory device) may include an additional memory array(s) analogous to array 106.

Figure 1B:
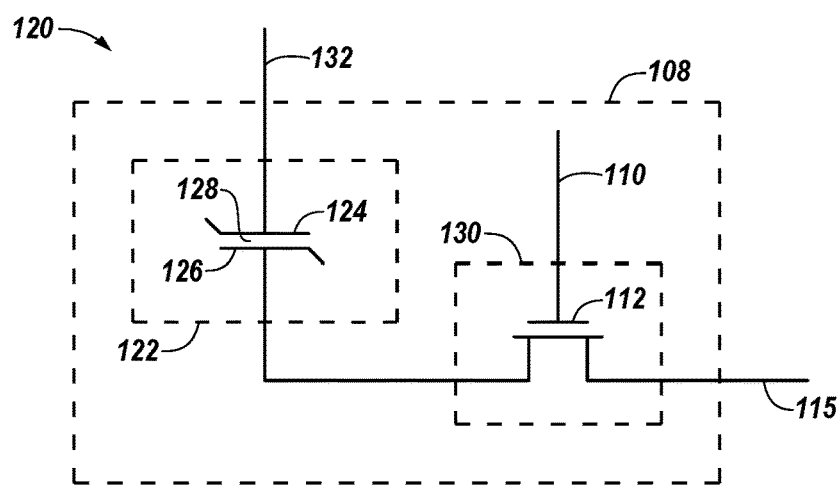
FIG. 1B illustrates an example of a memory cell in accordance with an embodiment of the present disclosure.

FIG. 1B illustrates an example circuit 120 that includes a memory cell 108 in accordance with an embodiment of the present disclosure. As shown in FIG. 1B, circuit 120 may include a ferroelectric memory (e.g., FeRAM) cell 108, an access line 110, and a data line 115 that may respectively be examples of a memory cell 108, an access line 110, and a data line 115, shown in FIG. 1A.

As shown in FIG. 1B, memory cell 108 may include a storage element, such as a capacitor 122, that may have a first plate, such as a cell plate 124, and a second plate, such as a cell bottom 126. Cell plate 124 and cell bottom 126 may be capacitively coupled through a ferroelectric material 128 positioned between them. The orientation of cell plate 124 and cell bottom 126 may be flipped without changing the operation of memory cell 108.

As shown in FIG. 1B, circuit 120 may include a select device 130, such as a select transistor. For example, the control gate 112 of select device 130 may be coupled to access line 110. In the example of FIG. 1B, cell plate 124 may be accessed via plate line 132, and cell bottom 126 may be accessed via data line 115. For example, select device 130 may be used to selectively couple data line 115 to cell bottom 126 in response to access line 110 activating select device 130. For example, capacitor 122 may be electrically isolated from data line 115 when select device 130 is deactivated, and capacitor 122 may be electrically coupled to data line 115 when select device 130 is activated. Activating select device 130 may be referred to as selecting memory cell 108, for example.

In an example, sources of an electric field or energy, such as positive or negative electrical pulses (e.g., positive or negative voltage or current pulses), can be applied to the storage element of memory cell 108 (e.g., to capacitor 122) for a particular duration to program the cell to a target data state. For instance, when the electric field (e.g., the electrical pulses) is applied across the ferroelectric material 128 of capacitor 122, the dipoles of ferroelectric material 128 may align in the direction of the applied electric field. The dipoles may retain their alignment (e.g., polarization state) after the electric field is removed, and different logic states (e.g., 0 and 1) may be stored as the different polarization states of the ferroelectric material 128. Accordingly, memory cell 108 may be programmed by charging cell plate 124 and cell bottom 126, which may apply an electric field across ferroelectric material 128 and place the ferroelectric material in a particular polarization state (e.g., depending on the polarity of the applied field) that may correspond to a particular data (e.g., logic) state. The data state of the memory cell may subsequently be determined (e.g., sensed) by determining which polarization state the ferroelectric material is in, as will be further described herein.

Figure 2:
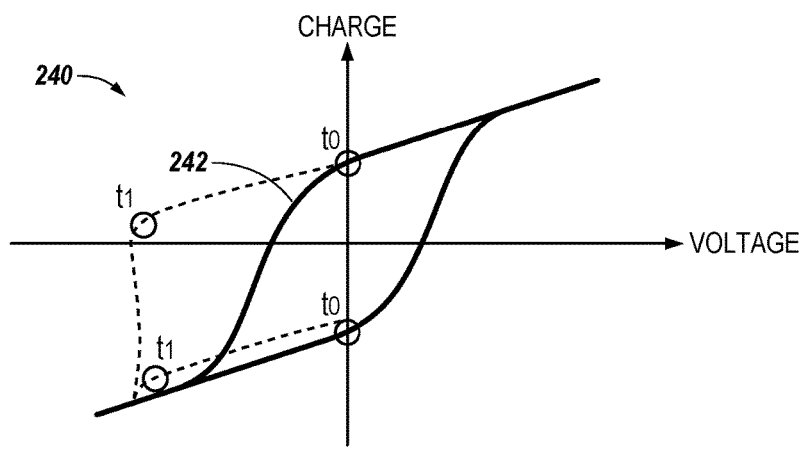
FIG. 2 is an example of a diagram illustrating the relationship between an applied electric field and the stored charge of a memory cell in accordance with an embodiment of the present disclosure.

FIG. 2 is an example of a diagram 240 illustrating the relationship 242 between an applied electric field (e.g., voltage) and the stored charge of a memory cell (e.g., the charge discharged by the memory cell in response to the applied voltage) in accordance with an embodiment of the present disclosure. The memory cell can be, for example, a ferroelectric memory (e.g., FeRAM) cell, such as, for instance, memory cell 108 previously described in connection with FIGS. 1A-1B. As illustrated in FIG. 2, this relationship 240 may take the form of a hysteresis loop.

When a sensing voltage is applied to the memory cell (e.g., during a sense operation being performed on the cell), current may flow through, and be output by, the memory cell in response to the sensing voltage being applied to the cell. This current, which can correspond to the amount of charge discharged by the memory cell (e.g. by the capacitor of the memory cell) while the sensing voltage is being applied to the memory cell, can be separated (e.g., divided) into two components. The first component, which may be referred herein as the displacement or dielectric component, can correspond to the charge discharged by the memory cell as a result of the physical dimensional characteristics of the memory cell, such as the distance between the plates of the capacitor of the cell, and may be discharged almost immediately upon the sensing voltage being applied to the cell. The second component, which may be referred to herein as the polar component, can correspond to the charge discharged by the memory cell as a result of the characteristics of the ferroelectric material of the capacitor of the cell, and may be discharged with a particular delay due to the characteristics of the ferroelectric material.

For example, if the memory cell has been programmed to a first data state (e.g., 0) corresponding to a first polarization state of the ferroelectric material of the memory cell, the alignment of the dipoles of the ferroelectric material of the memory cell may not change in response to the sensing voltage being applied to the cell, and accordingly the memory cell may not discharge any charge attributable to a change in the dipole alignment of the ferroelectric material (e.g., the memory cell may discharge only charge attributable to the physical dimensional characteristics of the cell). This polarization state may be referred to as a displacement state. However, if the memory cell has been programmed to a second data state (e.g., 1) corresponding to a second polarization state of the ferroelectric material of the memory cell, the alignment of the dipoles of the ferroelectric material of the cell may change (e.g., switch and/or flip) in response to the sensing voltage being applied to the cell, and accordingly the cell may discharge a charge attributable to the change in the dipole alignment of the ferroelectric material in addition to (e.g., after) the charge attributable to the physical dimensional characteristics of the cell. This polarization state may be referred to as a polar state. Time t0 illustrated in FIG. 2 may correspond to the initial time when the sensing voltage is begun to be applied to the memory cell (e.g., the beginning of the displacement component of the discharged charge), and time t1 illustrated in FIG. 2 may correspond to the time when the change in the dipole alignment of the ferroelectric material of the cell may occur (e.g., the end of the displacement component and the beginning of the polar component of the discharged charge).

As such, the data state of the memory cell can be determined by separating the first current component output by the memory cell while the sensing voltage is being applied to the cell and the second current component output by the memory cell while the sensing voltage is being applied to the cell (e.g., by separating the displacement and polar components of the current). The first current component can correspond to the first (e.g., displacement) polarization state of the ferroelectric material of the cell, and the second current component can correspond to the second (e.g., polar) polarization state of the cell, as previously described herein. That is, the first current component may include the current output by the cell while the sensing voltage is being applied to the cell before a particular reference time, and the second current component may include the current output by the cell while the sensing voltage is being applied to the cell after the particular reference time, with the reference time based on (e.g., related to) the time at which a change of the polarization state (e.g., a switching of the alignment of the dipoles) of the ferroelectric material of the memory cell will occur while the sensing voltage is being applied to the memory cell if the cell has been programmed to the second data state (e.g., time t1 illustrated in FIG. 2). This reference time may be, for instance, approximately ten nanoseconds after the sensing voltage has begun to be applied to the memory cell, and the sensing voltage may be (e.g. have a magnitude of), for instance, approximately 1.6 Volts.

The first and second current components can be separated, for example, by continuing to pre-charge (e.g., continuing to apply a pre-charge signal) to the data (e.g., digit) line to which the memory cell is coupled until the particular reference time has been reached while the sensing voltage is being applied to the memory cell. For instance, as part of the sense operation, the data line to which the memory cell is coupled may be pre-charged before the sensing voltage is applied to the cell (e.g., before time t0). Once the data line has been pre-charged, the sensing voltage may then be applied to the memory cell. However, while the sensing voltage is being applied to the memory cell, the pre-charge signal may continue to be applied to the data line until the particular reference time. Once the particular reference time has been reached, the pre-charge signal may be turned off, while the sensing voltage continues to be applied to the memory cell. This will enable the current output by the memory cell while the sensing voltage is being applied before the particular reference time to be separated from the current output by the memory cell while the sensing voltage is being applied after the particular reference time.

The data state of the memory cell can then be determined using only the second current component (e.g., the current output after the reference time). That is, the data state of the cell can be determined without using the first current component (e.g., the first current component can be wasted and/or eliminated from the sensing process). For example, the separation of the first and second current components can include separating the charge discharged by the memory cell corresponding to the first current component (e.g., the charge attributable to the physical dimensional characteristics of the memory cell) and the charge discharged by the memory cell corresponding to the second current component (e.g., the charge attributable to the change in dipole alignment of the ferroelectric material of the cell), and the data state of the cell can be determined using only the charge corresponding to the second current component (e.g., without using the charge corresponding to the first current component).

For example, the data state of the memory cell can be determined based on a comparison of (e.g., by comparing) a voltage amount associated with the charge discharged by the memory cell corresponding to the second current component and a reference voltage. If the comparison indicates this voltage amount is less than the reference voltage, then the memory cell has been programmed to the first data state (e.g., 0); if the comparison indicates this voltage amount is greater than the reference voltage, then the memory cell has been programmed to the second data state (e.g., 1). As an additional example, the data state of the memory cell can be determined based on the amount of time for which the second current component is output by the memory cell. For instance, the second current component may be exhausted sooner if the memory cell has been programmed to the second data state than if the cell has been programmed to the first data state, so the amount of time for which the second current is output by the memory cell may be shorter if the cell has been programmed to the second data state than if the cell has been programmed to the first data state. Examples of the circuitry that can be used to separate the current components output by the memory cell and determine the data state of the memory cell will be further described herein (e.g., in connection with FIGS. 3 and 6).

Determining the data state of the cell using only the second current component (e.g., without using the first current component) can increase the size of the sensing window used to distinguish between the two possible data states of the cell, which can make the determination of the data state more reliable (e.g., accurate) than in previous sensing approaches. Further, the sensing window can be obtained faster by using only the second current component, which can increase the speed at which the data state of the cell can be determined as compared to previous sensing approaches.

Figure 3:
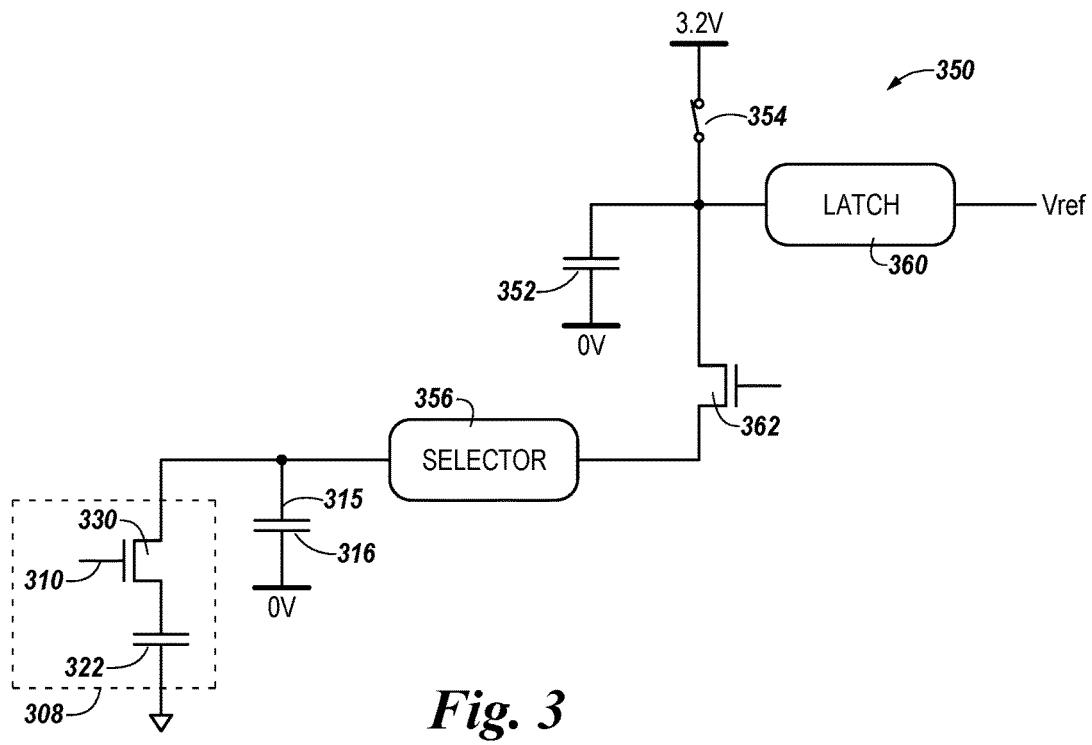
FIG. 3 illustrates an example of circuitry for current separation for memory sensing in accordance with an embodiment of the present disclosure.

FIG. 3 illustrates an example of circuitry (e.g., sense circuitry) 350 for current separation for memory sensing in accordance with an embodiment of the present disclosure. Circuitry 350 can be coupled to, and be included in the same apparatus (e.g., memory device) as, memory array 106 previously described in connection with FIGS. 1A-1B.

For example, as illustrated in FIG. 3, circuitry 350 can be coupled to an array that includes memory cells 308 that are analogous to memory cells 108 previously described in connection with FIGS. 1A-1B. For instance, as illustrated in FIG. 3, memory cell 308 can include a storage element (e.g., capacitor) 322, and a select device 330 coupled to an access line 310 and data (e.g., digit) line 315, in a manner analogous to that previously described in connection with FIGS. 1A-1B. Although a single memory cell 308 is shown in FIG. 3 for simplicity and so as not to obscure embodiments of the present disclosure, circuitry 350 can be coupled to each respective memory cell of the array.

Further, although not shown in FIG. 3 for simplicity and so as not to obscure embodiments of the present disclosure, circuitry 350 and/or the memory array that includes cells 308 can be coupled to a controller. The controller can include, for example, control circuitry and/or logic (e.g., hardware and/or firmware), and can be included on the same physical device (e.g., the same die) as the memory array, or can be included on a separate physical device that is communicatively coupled to the physical device that includes the memory array. In an embodiment, components of the controller can be spread across multiple physical devices (e.g., some components on the same die as the array, and some components on a different die, module, or board). The controller can operate circuitry 350 to utilize current separation as described herein to determine the data state of memory cell 308.

For example, as shown in FIG. 3, circuitry 350 can include a capacitor 352, which may be referred to herein as an amplification capacitor. Capacitor 352 can be coupled to memory cell 308 (e.g., via data line 315) through cascode 362 and selector 356, as illustrated in FIG. 3. Cascode 362 can be, for example, an n-channel metal-oxide-semiconductor field-effect transistor (MOSFET), and selector 356 can be, for example, a shunt comprising a number of switches.

Cascode 362 can be used to apply a sensing voltage to memory cell 308 (e.g., data line 315) during a sense operation being performed on the cell. For instance, cascode 362 can be used to bias memory cell 308 at the sensing voltage. Further, data line 315 may be pre-charged (e.g., by applying a pre-charge signal thereto) before the sensing voltage is applied to memory cell 308. Capacitor 316 illustrated in FIG. 3 may represent the capacitance of data line 315 once data line 315 has been pre-charged.

Once data line 315 has been pre-charged, the sensing voltage may then be applied to memory cell 308. While the sensing voltage is being applied to memory cell 308, the pre-charge signal may continue to be applied to data line 315 until the particular reference time previously described in connection with FIG. 2; after the particular reference time, the pre-charge signal may be turned off, as previously described in connection with FIG. 2. While the sensing voltage is being applied to memory cell 308, capacitor 352 can store only the charge discharged by memory cell 308 (e.g., by capacitor 322) that corresponds to the second (e.g., polar) current component output by memory cell 308 while the sensing voltage is being applied thereto (e.g., only the charge discharged after the particular reference time). That is, the charge discharged by memory cell 308 that corresponds to the first (e.g., displacement) current component output by memory cell 308 while the sensing voltage is being applied thereto (e.g., the charge discharged before the particular reference time, while data line 315 is continued to be pre-charged) may not be stored by capacitor 352 (e.g., this charge can be separated and eliminated by continuing to pre-charge data line 315). An example further illustrating the discharge of the charge stored by memory cell 308 to capacitor 352 will be further described herein (e.g., in connection with FIG. 4).

For instance, as shown in FIG. 3, circuitry 350 can include a switch 354 coupled to capacitor 352. Switch 352 may also be coupled to memory cell 308 through cascode 362 and selector 356, as illustrated in FIG. 3. Switch 354 can be used to separate the first current component output by memory cell 308 (e.g., the charge discharged by the cell before the particular reference time, while data line 315 continues to be pre-charged) while the sensing voltage is being applied thereto and the second current component output by memory cell 308 (e.g., the charge discharged by the cell after the particular reference time) while the sensing voltage is being applied thereto. For example, switch 354 can be enabled before the particular reference time, and disabled after the particular reference time. Only when switch 354 is disabled may charge discharged by memory cell 308 be stored by capacitor 352; the charge discharged by memory cell 308 may be separated and eliminated by enabling switch 354. Switch 354 can enabled, for example, by applying a signal (e.g., 3.2 Volts as illustrated in FIG. 3) thereto, and then disabled by turning off the signal.

The data state of memory cell 308 can then be determined based on the amount of charge stored by capacitor 352 (e.g., based on only the charge corresponding to the second current component). This determination can be performed, for example, using latch 360 of circuitry 350. Latch 360 can comprise latch circuitry, such as, for instance, a number of logic gates and/or switches, as will be appreciated by one of skill in the art.

For example, latch 360 can determine the data state of memory cell 308 based on a comparison of (e.g., by comparing) the voltage amount associated with the charge stored by capacitor 352 and a reference voltage (e.g., Vref illustrated in FIG. 3). If the comparison indicates the voltage amount associated with the charge stored by capacitor 352 is less than the reference voltage, then the memory cell has been programmed to the first data state (e.g., 0); if the comparison indicates the voltage amount associated with the charge stored by capacitor 352 is greater than the reference voltage, then the memory cell has been programmed to the second data state (e.g., 1). An example of a sensing window associated with such a comparison will be further described herein (e.g., in connection with FIG. 5).

Because only the charge corresponding to the second current component is stored by capacitor 352 for use in determining the data state of memory cell 308, capacitor 352 can have a lower capacitance than amplification capacitors used in previous sensing approaches. Accordingly, the size and/or power consumption of circuitry 350 may be less than the sense circuitry used in previous sensing approaches.

Figure 4:
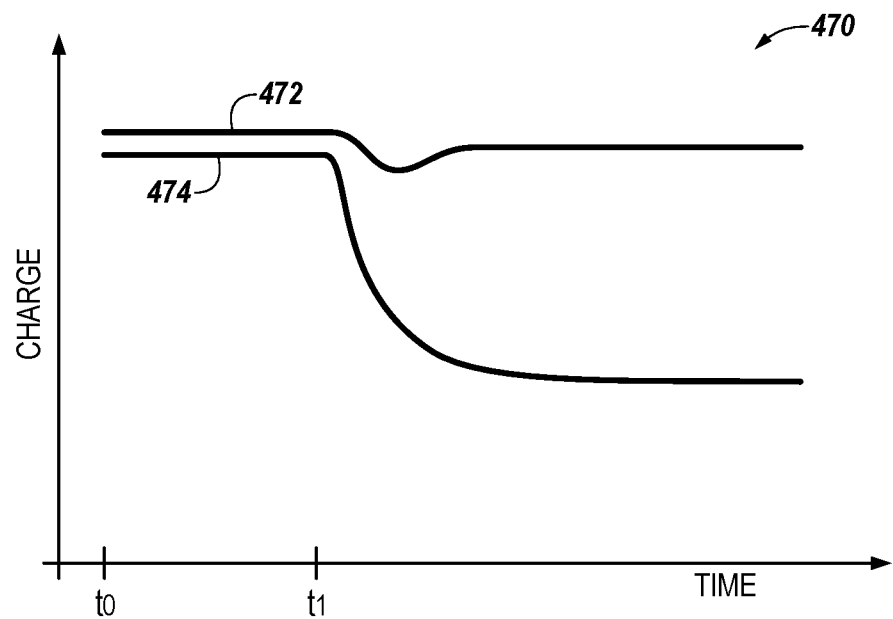
FIG. 4 illustrates an example of a timing diagram associated with sensing a memory cell in accordance with an embodiment of the present disclosure.

FIG. 4 illustrates an example of a timing diagram 470 associated with sensing a memory cell in accordance with an embodiment of the present disclosure. The memory cell can be, for example, memory cell 308 previously described in connection with FIG. 3.

As shown in FIG. 4, timing diagram 470 includes waveforms 472 and 474. Waveform 472 represents the charge being discharged from the memory cell to capacitor 352 previously described in connection with FIG. 3 during the sense operation if the memory cell has been programmed to the first (e.g., displacement) data state. Waveform 474 represents the charge being discharged from the memory cell to capacitor 352 during the sense operation if the memory cell has been programmed to the second (e.g., polar) data state. Time t0 illustrated in FIG. 4 can correspond to time t0 previously described in connection with FIG. 2 (e.g., the initial time when the sensing voltage of the sense operation is begun to be applied to the memory cell), and time t1 illustrated in FIG. 4 can correspond to time t1 (e.g., the particular reference time) previously described in connection with FIG. 2 (e.g., the time when the change in the dipole alignment of the ferroelectric material of the memory cell may occur if the cell has been programmed to the polar data state).

As shown in FIG. 4, after time t1, waveform 474 becomes lower than waveform 472, such that there is a spacing (e.g., gap) between waveforms 472 and 474. This spacing can correspond to the difference between the charges that will be discharged from the memory cell after time t1 depending on whether the cell has been programmed to the first or second data state, and can be used to determine the data state of the cell, as previously described herein (e.g., in connection with FIG. 3).

Figure 5:
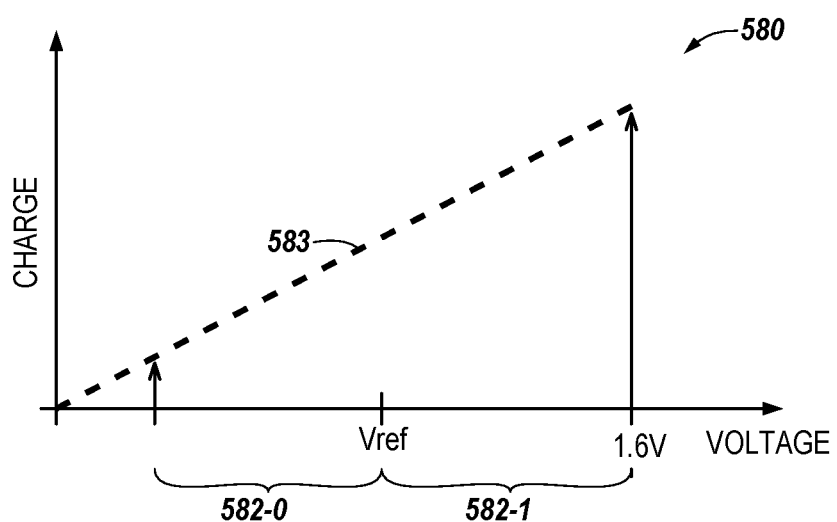
FIG. 5 is an example of a diagram illustrating a sensing window associated with sensing a memory cell in accordance with an embodiment of the present disclosure.

FIG. 5 is an example of a diagram 580 illustrating a sensing window associated with sensing a memory cell in accordance with an embodiment of the present disclosure. The memory cell can be, for example, memory cell 308 previously described in connection with FIG. 3.

As previously described in connection with FIG. 3, the data state of the memory cell can be determined based on a comparison of the voltage amount associated with the charge stored by capacitor 352 (e.g., the charge corresponding to the polar current component output by the memory cell) and a reference voltage (e.g., Vref illustrated in FIG. 5, which can correspond to Vref illustrated in FIG. 3). If the comparison indicates the voltage amount associated with the charge stored by capacitor 352 is less than the reference voltage (e.g., is within portion 582-0 of the sensing window illustrated in FIG. 5), then the memory cell has been programmed to the first data state (e.g., 0). If the comparison indicates the voltage amount associated with the charge stored by capacitor 352 is greater than the reference voltage (e.g., is within portion 582-1 of the sensing window illustrated in FIG. 5), then the memory cell has been programmed to the second data state (e.g., 1). That is, the sensing window illustrated in FIG. 5 may be used to distinguish between the two possible data states the memory cell may have been programmed to.

Portions 582-0 and 582-1 of the sensing window illustrated in FIG. 5 may be larger (e.g., wider) than those of sensing windows used to distinguish between data states in previous sensing approaches. As such, utilizing the sensing window illustrated in FIG. 5 to determine the data state of the memory cell can result in a more reliable (e.g., accurate) determination of the data state than in previous sensing approaches.

Further, the capacitance of capacitor 352, as represented by dashed line 583 in FIG. 5, can be lower than that of amplification capacitors used in previous sensing approaches. That is, the slope of line 583 may be less steep than for amplification capacitors used in previous sensing approaches. As such, the size and/or power consumption of sense circuitry used in accordance with the present disclosure may be less than that of sense circuitry used in previous sensing approaches.

Figure 6:
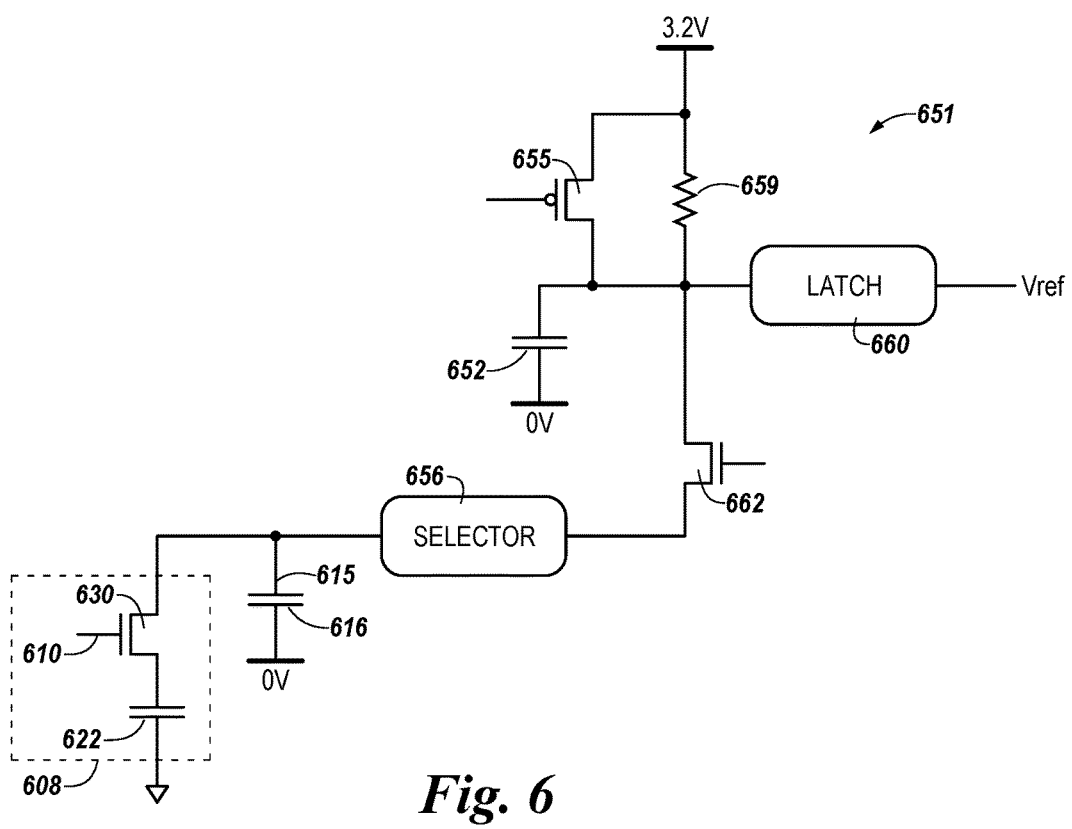
FIG. 6 illustrates an example of circuitry for current separation for memory sensing in accordance with an embodiment of the present disclosure.

FIG. 6 illustrates an example of circuitry (e.g., sense circuitry) 651 for current separation for memory sensing in accordance with an embodiment of the present disclosure. Circuitry 651 can be coupled to, and be included in the same apparatus (e.g., memory device) as, memory array 106 previously described in connection with FIGS. 1A-1B, in a manner analogous to circuitry 350 previously described in connection with FIG. 3. For example, as illustrated in FIG. 6, circuitry 651 can be coupled to an array that includes memory cells 608 that are analogous to memory cells 108 previously described in connection with FIGS. 1A-1B (e.g., that include a storage element 622, and a select device 630 coupled to an access line 610 and data line 615, in a manner analogous to that previously described in connection with FIGS. 1A-1B).

As shown in FIG. 6, circuitry 651 can include a capacitor (e.g., amplification capacitor) 652, a cascode 662, a selector 656, and a latch 660, which can be analogous to capacitor 352, cascode 362, selector 356, and latch 360 previously described in connection with FIG. 3. For example, cascode 662 can be used to apply a sensing voltage to memory cell 608, and capacitor 652 can store only the charge discharged by memory cell 608 that corresponds to the second (e.g., polar) current component output by memory cell 608 while the sensing voltage is being applied thereto, in a manner analogous to that previously described in connection with FIG. 3.

In the example illustrated in FIG. 6, circuitry 651 includes a transistor 655 coupled to capacitor 652. Transistor 655 may also be coupled to memory cell 608 through cascode 662 and selector 656, as illustrated in FIG. 6. Transistor 655 can be, for example, a p-channel MOSFET. Further, circuitry 651 can include a resistor 659 in parallel with transistor 655, as illustrated in FIG. 6. Resistor 659 may have a large resistance value. For instance, resistor 659 may be a linear resistor having a large resistance value, or may be created using a highly resistive MOS device, which may reduce the size (e.g. area) of circuitry 651.

Transistor 655 can be used to separate the first current component output by memory cell 608 while the sensing voltage is being applied thereto and the second current component output by memory cell 308 while the sensing voltage is being applied thereto, in a manner analogous to that previously described for switch 354 in connection with FIG. 3. For example, transistor 655 can be enabled before the particular reference time, and disabled after the particular reference time, in a manner analogous to that previously described for switch 354.

The data state of memory cell 608 can then be determined based on the amount of charge stored by capacitor 652 (e.g., based on only the charge corresponding to the second current component). This determination can be performed, for example, using latch 660 of circuitry 651, in a manner analogous to that previously described for latch 360 in connection with FIG. 3.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of operating memory, comprising:
    pre-charging a data line to which a memory cell having a ferroelectric material is coupled before applying a sensing voltage to the memory cell;
    applying a sensing voltage to the memory cell; and
    determining a data state of the memory cell by separating a first current output by the memory cell while the sensing voltage is being applied to the memory cell and a second current output by the memory cell while the sensing voltage is being applied to the memory cell by continuing to pre-charge the data line to which the memory cell is coupled while the sensing voltage is being applied to the memory cell until a particular reference time, wherein:
        the first current output by the memory cell corresponds to a first polarization state of the ferroelectric material of the memory cell; and
        the second current output by the memory cell corresponds a second polarization state of the ferroelectric material of the memory cell.

2. The method of claim 1 wherein the particular reference time is based on a time at which a polarization state of the ferroelectric material of the memory cell changes from the first polarization state to the second polarization state.

3. The method of claim 1, wherein:
    separating the first current output by the memory cell while the sensing voltage is being applied to the memory cell and the second current output by the memory cell while the sensing voltage is being applied to the memory cell includes separating charge discharged by the memory cell corresponding to the first current output by the memory cell and charge discharged by the memory cell corresponding to the second current output by the memory cell; and
    the data state of the memory cell is determined using only the charge discharged by the memory cell corresponding to the second current output by the memory cell.

4. The method of claim 3, wherein the method includes determining the data state of the memory cell based on a comparison of:
    a voltage amount associated with the charge discharged by the memory cell corresponding to the second current output by the memory cell; and
    a reference voltage.

5. An apparatus comprising:
    a memory cell having a ferroelectric material; and
    circuitry configured to:
        apply a sensing voltage to the memory cell; and
        determine a data state of the memory cell by separating a current output by the memory cell while the sensing voltage is being applied to the memory cell before a particular reference time and a current output by the memory cell while the sensing voltage is being applied to the memory cell after the particular reference time, wherein the particular reference time is based on a time at which a change of a polarization state of the ferroelectric material of the memory cell occurs.

6. The apparatus of claim 5, wherein the circuitry is configured to:
    pre-charge a data line to which the memory cell is coupled before applying the sensing voltage to the memory cell; and
    separate the current output by the memory cell while the sensing voltage is being applied to the memory cell before the particular reference time and the current output by the memory cell while the sensing voltage is being applied to the memory cell after the particular reference time by continuing to pre-charge the data line to which the memory cell is coupled while the sensing voltage is being applied to the memory cell until the particular reference time.

7. The apparatus of claim 5, wherein:
    the circuitry includes a capacitor coupled to the memory cell and configured to store only charge discharged by the memory cell corresponding to the second current output by the memory cell while the sensing voltage is being applied to the memory cell; and
    the circuitry is configured to determine the data state of the memory cell based on the charge stored by the capacitor.

8. The apparatus of claim 7, wherein the circuitry is configured to determine the data state of the memory cell based on a comparison of:
    a voltage amount associated with the charge stored by the capacitor; and
    a reference voltage.

9. The apparatus of claim 8, wherein:
    the data state of the memory cell is a first data state upon the comparison indicating the voltage amount associated with the charge stored by the capacitor is less than the reference voltage; and
    the data state of the memory cell is a second data state upon the comparison indicating the voltage amount associated with the charge stored by the capacitor is greater than the reference voltage.

10. The apparatus of claim 6, wherein the circuitry includes a cascode configured to couple the capacitor to the memory cell.

11. The apparatus of claim 6, wherein charge discharged by the memory cell corresponding to the first current output by the memory cell while the sensing voltage is being applied to the memory cell is not stored by the capacitor.

12. A method of operating memory, comprising:
applying a sensing voltage to a memory cell having a ferroelectric material;
separating a first current output by the memory cell while the sensing voltage is being applied to the memory cell and a second current output by the memory cell while the sensing voltage is being applied to the memory cell, wherein:
the first current corresponds to a first polarization state of the ferroelectric material of the memory cell; and
the second current corresponds a second polarization state of the ferroelectric material of the memory cell wherein the first polarization state is different from the second polarization state; and
determining a data state of the memory cell using only the second current output by the memory cell.

13. The method of claim 12, wherein determining the data state of the memory cell using only the second current output by the memory cell includes determining the data state of the memory cell without using the first current output by the memory cell.

14. The method of claim 12, wherein the method includes determining the data state of the memory cell based on an amount of time for which the second current is output by the memory cell.

15. An apparatus comprising:
a memory cell having a ferroelectric material; and
circuitry configured to:
apply a sensing voltage to the memory cell;
separate a current output by the memory cell while the sensing voltage is being applied to the memory cell before a particular reference time and a current output by the memory cell while the sensing voltage is being applied to the memory cell after the particular reference time, wherein the particular reference time is based on a time at which a change of a polarization state of the ferroelectric material of the memory cell occurs; and
determine a data state of the memory cell using only the current output by the memory cell while the sensing voltage is being applied to the memory cell after the particular reference time.

16. The apparatus of claim 15, wherein the circuitry includes a switch configured to separate the current output by the memory cell while the sensing voltage is being applied to the memory cell before the particular reference time and the current output by the memory cell while the sensing voltage is being applied to the memory cell after the particular reference time.

17. The apparatus of claim 15, wherein the circuitry includes a transistor configured to separate the current output by the memory cell while the sensing voltage is being applied to the memory cell before the particular reference time and the current output by the memory cell while the sensing voltage is being applied to the memory cell after the particular reference time.

18. The apparatus of claim 17, wherein the circuitry includes a resistor in parallel with the transistor.

19. The apparatus of claim 17, wherein the transistor is a p-channel metal-oxide-semiconductor field-effect transistor (MOSFET).

20. A method of operating memory, comprising:
applying a sensing voltage to a memory cell having a ferroelectric material;
pre-charging a data line to which the memory cell is coupled before applying the sensing voltage to the memory cell;
continuing to pre-charge the data line to which the memory cell is coupled while the sensing voltage is being applied to the memory cell until a particular reference time, wherein the particular reference time is based on a time at which a change of a polarization state of the ferroelectric material of the memory cell occurs; and
determining a data state of the memory cell by separating a current output by the memory cell while the sensing voltage is being applied to the memory cell before the particular reference time and a current output by the memory cell while the sensing voltage is being applied to the memory cell after the particular reference time.

21. The method of claim 20, wherein the method includes separating the current output by the memory cell while the sensing voltage is being applied to the memory cell before the particular reference time and the current output by the memory cell while the sensing voltage is being applied to the memory cell after the particular reference time by:
enabling a switch coupled to the memory cell before the particular reference time; and
disabling the switch after the particular reference time.

22. The method of claim 20, wherein the method includes separating the current output by the memory cell while the sensing voltage is being applied to the memory cell before the particular reference time and the current output by the memory cell while the sensing voltage is being applied to the memory cell after the particular reference time by:
enabling a transistor coupled to the memory cell before the particular reference time; and
disabling the transistor after the particular reference time.

23. The method of claim 20, wherein the particular reference time is approximately ten nanoseconds after the sensing voltage has begun to be applied to the memory cell.

24. An apparatus, comprising:
a memory cell having a ferroelectric material; and
circuitry configured to:
apply a sensing voltage to the memory cell;
pre-charge a data line to which the memory cell is coupled before applying the sensing voltage to the memory cell;
continue to pre-charge the data line to which the memory cell is coupled while the sensing voltage is being applied to the memory cell until a particular reference time;
separate a current output by the memory cell while the sensing voltage is being applied to the memory cell before the particular reference time and a current output by the memory cell while the sensing voltage is being applied to the memory cell after the particular reference time; and
determine a data state of the memory cell using only the current output by the memory cell while the sensing voltage is being applied to the memory cell after the particular reference time.

25. The apparatus of claim 24, wherein the circuitry includes a cascode coupled to the memory cell and configured to apply the sensing voltage to the memory cell.

26. The apparatus of claim 24, wherein the circuitry includes a latch configured to determine the data state of the memory cell.

27. The apparatus of claim 24, wherein the sensing voltage is approximately 1.6 Volts.

28. The apparatus of claim 24, wherein the ferroelectric material is an oxide material.

29. A method of operating memory, comprising:
applying a sensing voltage to a memory cell having a ferroelectric material; and
determining a data state of the memory cell by:
- separating a first current output by the memory cell while the sensing voltage is being applied to the memory cell and a second current output by the memory cell while the sensing voltage is being applied to the memory cell, including separating charge discharged by the memory cell corresponding to the first current output by the memory cell and charge discharged by the memory cell corresponding to the second current output by the memory cell, wherein:
  - the first current output by the memory cell corresponds to a first polarization state of the ferroelectric material of the memory cell;
  - the second current output by the memory cell corresponds a second polarization state of the ferroelectric material of the memory cell wherein the first polarization state is different from the second polarization state; and
- using only the charge discharged by the memory cell corresponding to the second current output by the memory cell.

30. An apparatus comprising:
a memory cell having a ferroelectric material; and
circuitry configured to:
- apply a sensing voltage to the memory cell; and
- determine a data state of the memory cell by separating a first current output by the memory cell while the sensing voltage is being applied to the memory cell before a particular reference time and a second current output by the memory cell while the sensing voltage is being applied to the memory cell after the particular reference time;

wherein:
- the circuitry includes a capacitor coupled to the memory cell and configured to store only charge discharged by the memory cell corresponding to the second current output by the memory cell while the sensing voltage is being applied to the memory cell; and
- the circuitry is configured to determine the data state of the memory cell based on the charge stored by the capacitor.

* * * * *